(12) United States Patent
Zheng

(10) Patent No.: US 6,693,481 B1
(45) Date of Patent: Feb. 17, 2004

(54) FUSE CIRCUIT UTILIZING HIGH VOLTAGE TRANSISTORS

(75) Inventor: Bo Zheng, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/223,249

(22) Filed: Aug. 20, 2002

(51) Int. Cl.[7] .................. H01H 37/76; H01H 85/00
(52) U.S. Cl. .................... 327/525; 365/225.7
(58) Field of Search ............ 327/525, 526; 365/225.7

(56) References Cited

U.S. PATENT DOCUMENTS

| 5,418,487 A | * | 5/1995 | Armstrong, II | 327/525 |
| 5,959,445 A | * | 9/1999 | Denham | 323/315 |
| 6,417,720 B1 | * | 7/2002 | Denham | 327/525 |

* cited by examiner

*Primary Examiner*—Terry D. Cunningham
*Assistant Examiner*—Quan Tra
(74) *Attorney, Agent, or Firm*—Blakely, Sokoloff, Taylor & Zafman LLP

(57) ABSTRACT

A fuse circuit is provided with vertical-drain NMOS transistors and vertical-source-drain NMOS transistors serving as switches that are configured to enable and operate with high fuse programming voltage for optimal fuse programming yield.

18 Claims, 10 Drawing Sheets

FUSE CIRCUIT UTILIZING HIGH VOLTAGE TRANSISTORS

FIELD

The present invention is directed to fuse circuits included within semiconductor devices. More particularly, the present invention is directed to a fuse circuit utilizing high voltage transistors operable with high fuse programming voltage for optimal fuse programming yield.

BACKGROUND

Most semiconductor integrated circuit ("IC") devices now in use are generally fabricated in what is called CMOS (Complementary Metal Oxide Semiconductor) technology, which forms both PMOS and NMOS transistors in a silicon substrate. The objective of IC technology is to minimize transistor size and increase the density of core transistors in IC devices.

Examples of semiconductor IC devices include programmable read-only memory (PROM) devices, programmable logic arrays (PLA), and other types of memory arrays, such as dynamic random access memory (DRAM), static random access memory (SRAM), video random access memory (VRAM) and erasable programmable read-only memory (EPROM). These IC devices are typically designed with a number of redundant component elements that may be used to replace defective components in order to provide a fully functional circuit. These redundant components may be individual memory rows, memory columns or even individual memory cells in a particular row and column. In addition, one or more fuses may be used, in conjunction with other circuit elements, to control various circuit parameters (i.e. a digital value, a voltage, a current etc.). In general, a fuse operates in one of two states (programmed or un-programmed), namely a "closed" (i.e. low resistance) state, and an "open" (i.e. high resistance) state, in order to isolate the defective component and to selectively connect the redundant component in place of the defective component. In addition, such fuses may also be used to store process information of the IC devices (i.e., chip identification) for subsequent use to identify the IC devices.

A variety of fuses have been used in IC devices. For example, one fuse structure is formed by the so-called "Zener zap" method. Another example fuse structure is a metal link formed of tungsten. However, metal link fuses require large programming currents and are not viable for use with IC devices formed using newer process technologies.

A more recent fuse structure is the poly fuse ("polysilicon" or "poly resistor" fuse). One advantage of the poly fuse over the metal link fuse is the lesser amount of current required to open the fuse element during programming. Typical poly fuses in a fuse array exhibit a pre-burned resistance of 30–100 ohms and a post-burned resistance ranging from a few hundreds to thousands ohms. In order to burn (or blow) the poly fuses in a fuse cell effectively, a relatively high fuse programming voltage is required. Under the current practice, however, the highest fuse programming voltage applied to poly fuses in a fuse array is limited to the common chip core burn-in voltage (Vcc) to insure reliability. Unfortunately, the common chip core burn-in voltage (Vcc) is not sufficient to program the fuses in the fuse array effectively. As a result, the fuse programming failure rate in a fuse array is high and, likewise, the fuse programming yield remains unacceptably low.

Therefore, a need exists for a new fuse circuit for implementation within IC devices formed using standard CMOS processes which utilizes high voltage transistors configured to operate with high fuse programming voltage for optimal fuse programming yield.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION

Figure 1A:
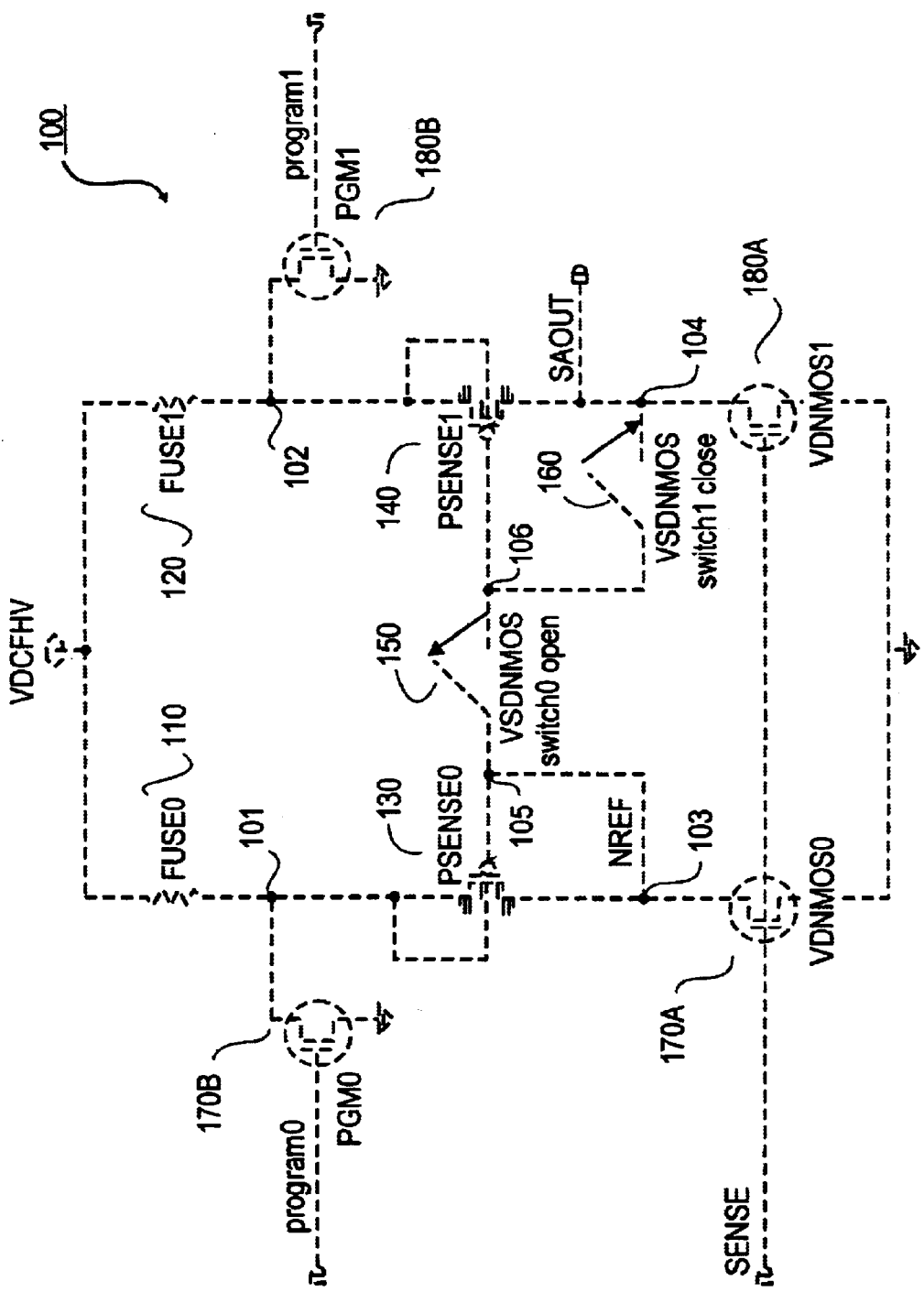
FIGS. 1A–1B illustrate an example fuse circuit for fuse programming and sensing according to an example embodiment of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. As manufacturing techniques (e.g., photolithography) mature over time, it is expected that devices of smaller size could be manufactured. With regard to description of any timing or programming signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to IC devices and other components may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details.

The present invention is applicable for use with all types of semiconductor IC devices that may be fabricated using CMOS technology. Examples of these IC devices may include programmable read-only memory (PROM) devices, programmable logic arrays (PLA), and other types of memory arrays, such as dynamic random access memory (DRAM), static random access memory (SRAM), video random access memory (VRAM) and erasable programmable read-only memory (EPROM).

Figure 1B:
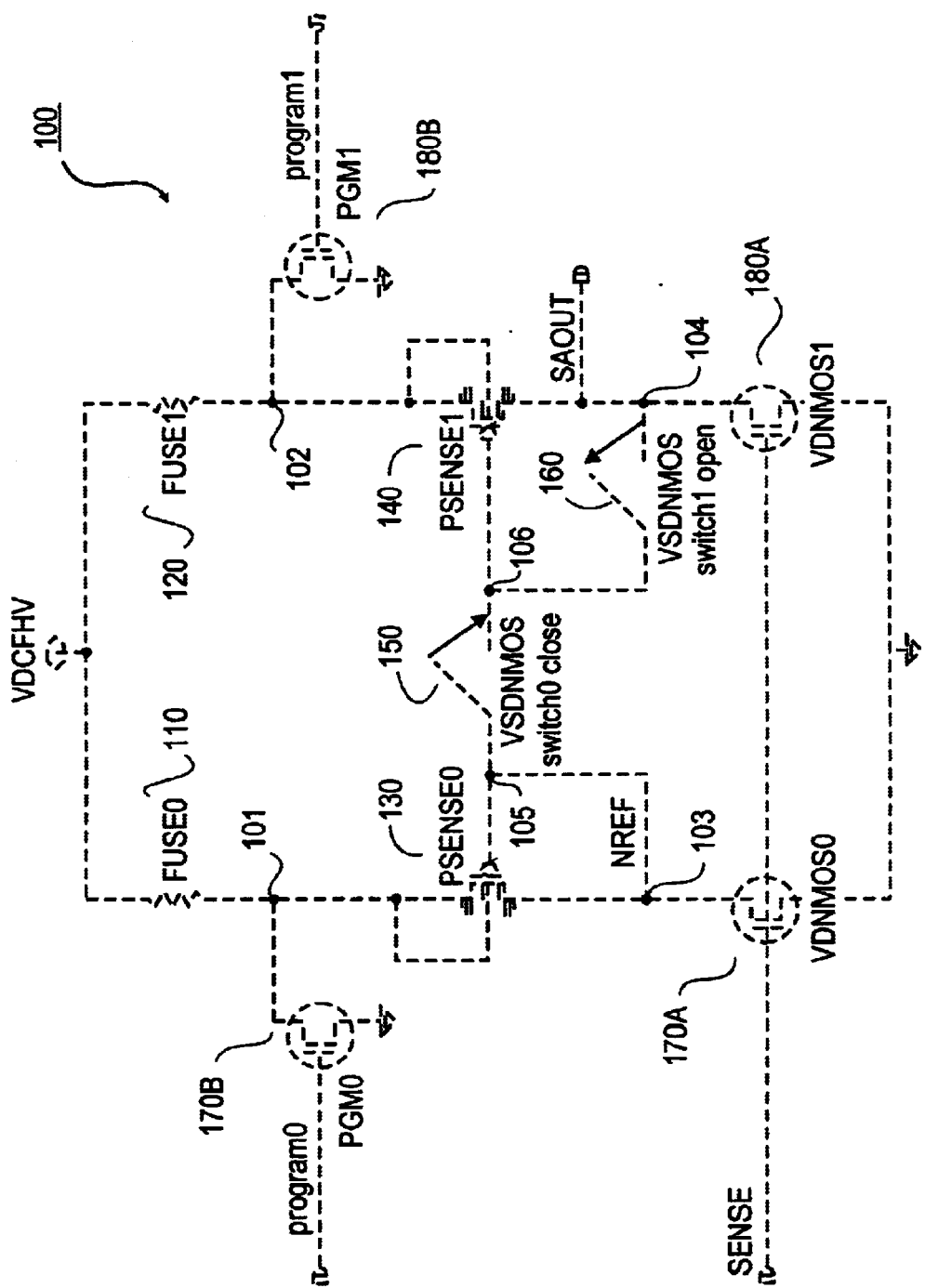

Attention now is directed to the drawings and particularly to FIGS. 1A–1B, in which an example fuse circuit 100 for implementation with semiconductor IC devices according to an example embodiment of the present invention is illustrated. As previously discussed, these semiconductor IC devices may be fabricated using CMOS process technology, and are typically designed with a number of redundant component elements that may be used to replace defective components, and other I/O circuitry (not shown) such as, for example, an address decoder, a control circuit, and a read/write circuit in order to provide a fully functional circuit. If the IC device is a memory device, the redundant components may be individual memory rows, memory columns in a redundant memory array used to replace defective memory rows, memory columns in a memory array, or even individual memory cells in a particular row and column of a redundant memory array used to replace defective memory cells in a particular row and column of a memory array. The fuse circuit 100 may be implemented as part of a repair circuit (not shown) within the IC device or in connection with a programming circuit (not shown) within the IC device, and may be used in a variety of applications, including selectively enabling or disabling components on an IC device. For example, in a DRAM, the fuse structure may be used to enable redundant rows of memory cells used to replace defective rows of memory cells and thereby allowing an otherwise defective memory to be utilized.

As shown in FIGS. 1A–1B, the fuse circuit 100 may comprise fuse elements (fuseØ and fuse1) 110–120; p-channel metal oxide semiconductor (PMOS) transistors 130–140; vertical-source-drain n-channel MOS (VSDNMOS) transistors shown by symbolic switches (switchØ and switch1) 150–160; and vertical-drain-NMOS (VDNMOS) transistors 170A–70B and 180A–180B0 arranged to program the fuses 110–120 and sense the status of such fuses 110–120, thereby enabling the repair of a defective component, i.e., to isolate the defective component and to selectively connect the redundant component in place of the defective component within the IC device.

The VDNMOS transistors 170B–180B may be arranged to function as a programming circuit used to program the fuse elements, fuseØ and fuse1, 110–120, using a high programming voltage. As a result, the VDNMOS transistors 170B–180B may be referred to as programming transistors. Likewise, the PMOS transistors 130–140, the VSDNMOS transistors serving as switches (switchØ and switch1) 150–160, and the VDNMOS transistors 170A–180A may be arranged to function as a sensing circuit used to sense the status of each of the fuse elements, fuseØ and fuse1, 110–120 before or after programming the fuse elements, fuseØ and fuse1 110–120. As a result, the PMOS transistors 130–140, the VSDNMOS transistors serving as switches (switchØ and switch1) 150–160, and the VDNMOS transistors 170A–180A may be referred to as sensing transistors.

PMOS transistors 130–140 are regular transistors. Both the VSDNMOS transistors serve as switches (switchØ and switch1) 150–160, and are high voltage transistors that can tolerate high voltage at both source (S) and drain (D) and, thus, are ideal for programming fuse application. Both the VSDNMOS transistors serving as switches (switchØ and switch1) 150–160 may function as diodes to enable high programming voltage. For example, during programming of fuse 110, the VSDNMOS transistor (switchØ) 150 may be open and the VSDNMOS transistor (switch1) 160 may be closed (as well as all other switches in a fuse array). During sensing of the same fuse 110, the VSDNMOS transistor (switchØ) 150 may be closed and the VSDNMOS transistor (switch1) 160 may be open (as well as all other switches in a fuse array).

Likewise, the VDNMOS transistors 170A–170B and 180A–180B may be high voltage transistors. However, the VDNMOS transistors 170B–180B may be larger in size than the VDNMOS transistors 170A–180A and, as a result, can tolerate higher voltage applications, thereby enabling sufficiently large current to burn (blow) the fuse elements (e.g., fuseØ and fuse1) 110 and 120 in order to ensure high fuse programming yield.

Such a fuse circuit 100 as shown in FIGS. 1A–1B is only intended to illustrate a simple fuse cell containing adjacent fuse elements (e.g., fuseØ and fuse1), a programming circuit used to program the fuse elements (e.g., fuseØ and fuse1), and a sensing circuit used to sense the status of such fuse elements (e.g., fuseØ and fuse1). In a fuse array containing hundreds or thousands of fuses, there may be corresponding programming transistors and sensing transistors arranged to control fuse programming or sensing operations.

Referring back to FIGS. 1A–1B, fuse elements (fuseØ and fuse1) 110 and 120 may be traditional poly silicon fuses each of which presents a low impedance between conductive plates (not shown) before being programmed or "blow", and a relatively high impedance between conductive plates (not shown) after being programmed. Such fuses 110 and 120 are connected between a fuse high voltage terminal $V_{ccfhv}$ and nodes 101 and 102. In particular, the fuseØ 110 has one of its terminals coupled to the fuse high voltage terminal $V_{ccfhv}$ and its other terminal coupled to node 101. Likewise, the fuse1 120 also has one of its terminals coupled to the fuse high voltage terminal $V_{ccfhv}$ and its other terminal coupled to node 102. The fuse high voltage terminal $V_{ccfhv}$ may supply a high fuse voltage of approximately 4–5 volts, for example, to ensure high fuse programming yield.

PMOS transistors (psenseØ and psense1) 130 and 140 are connected in series with the fuses 110 and 120. In particular, the PMOS transistor 130 has its source (S) coupled to node 101, its drain (D) coupled to node 103, and its gate electrode (G) coupled to the drain (D). Similarly, the PMOS transistor 140 has its source (S) coupled to node 102, and its drain (D) coupled to node 104. Both PMOS transistors 130 and 140 are connected in a current mirror configuration during sensing operation (switchØ is closed, and switch1 is open). Both PMOS transistors 130 and 140 are arranged in a diode-connection configuration during programming operation (switchØ is open, and switch1 is closed).

VSDNMOS transistors (switchØ and switch1) 150 and 160 are connected between the PMOS transistors 130 and 140. In particular, the VSDNMOS transistor (switchØ) 150 is connected between the gate electrode (G) of the PMOS transistor 130 and the gate electrode (G) of the PMOS transistor 140. The VSDNMOS transistor (switch1) 160 is connected between the gate electrode (G) and the drain (D) of the PMOS transistor 140.

VDNMOS transistors 170A–180A are connected between nodes 103–104 and a ground terminal. In particular, the VDNMOS transistor 170A has its drain (D) coupled to node 103, its source (S) coupled to the ground terminal and its gate electrode (G) coupled to receive a sense signal (i.e., a sensing voltage of, for example, 0 volt or 1.2 volts). Similarly, VDNMOS transistor 180A has its drain (D) coupled to node 104, its source (S) coupled to ground, and its gate electrode (G) coupled to receive a sense signal (for example, either 1.2 volts or 0 volt). Each of the VDNMOS transistors 170A–180A can tolerate high voltage at drain (D) side (for example, as high as 4–5 volts during programming) and regular core voltage at gate/source (for example, 1.2 volts).

VDNMOS transistors 170B–180B are coupled to nodes 101–102 to program the fuses 110 and 120. In particular, the VDNMOS transistor 170B has its drain (D) coupled to node 101, its source (S) coupled to a ground terminal and its gate electrode (G) coupled to receive a program signal (i.e., a programming voltage of, for example, 0 volt or 1.2 volts). Similarly, VDNMOS transistor 180B has its drain (D) coupled to node 102, its source (S) coupled to the ground terminal, and its gate electrode (G) coupled to receive a program signal (for example, either 1.2 volts or 0 volt). Each of the VDNMOS transistors 170B–180B can tolerate high voltage only at drain (D) side (for example, as high as 4–5 volts during programming).

In order to program the fuse 110, for example, a programming voltage of a sufficient magnitude may be applied across the conductive plates (not shown) causing a "breakdown" of the fuse 110. For example, a programming voltage of approximately 4–5 volts from the fuse high voltage terminal $V_{ccfhv}$ may be used to break down the fuses 110 and 120.

When arranged in the manner described with reference to FIG. 1A, the VDNMOS transistors 170B–180B are used to program fuse 110, for example, in response to a program signal. The switchØ 150 is open and the switch1 160 is closed (as well as all other switches in a fuse array), so that the left side of the fuse circuit 100 is disconnected from the right side of the fuse circuit 100. Since both the PMOS transistors 130 and 140 are diode-connected, higher voltage can be tolerated (for example, up to N-well breakdown voltage). As a result, the fuse programming voltage is no longer limited by PMOS reliability. Instead, the fuse programming voltage can only be limited by the maximum burn-in voltage of the VDNMOS transistors 170A–180A as well as the VSDNMOS transistors 150–160 which can be in the range of 4–5 volts for optimal programming yield. During programming, sense controls are off.

When arranged in the manner described with reference to FIG. 1B, the VDNMOS transistors 170B–180B are used to sense the status of fuse 110, for example, in response to a sense signal. Sensing may be performed after the programming in order to determine if fuse 110 has been burned (blown). The switchØ 150 is closed and the switch1 160 is open (as well as all other switches in the fuse array), so that the left side of the fuse circuit 100 is connected to the right side of the fuse circuit 100 in a current mirror configuration. Both the PMOS transistors 130 and 140, when arranged in a current mirror configuration, are very sensitive to the difference between the two fuse resistances. As a result, an analog output "0" or "1" can be generated at an output node (SAOUT), depending on which side of the fuse 110 or fuse 120 is burned (blown). During sensing, program controls are off, and the high programming voltage from the fuse high voltage terminal $V_{ccfhv}$ is not needed. The fuse high voltage terminal $V_{ccfhv}$ may be at the same voltage as the regular core voltage $V_{cc}$ so that there is no need to protect the PMOS transistors 130–140.

Figure 2A:
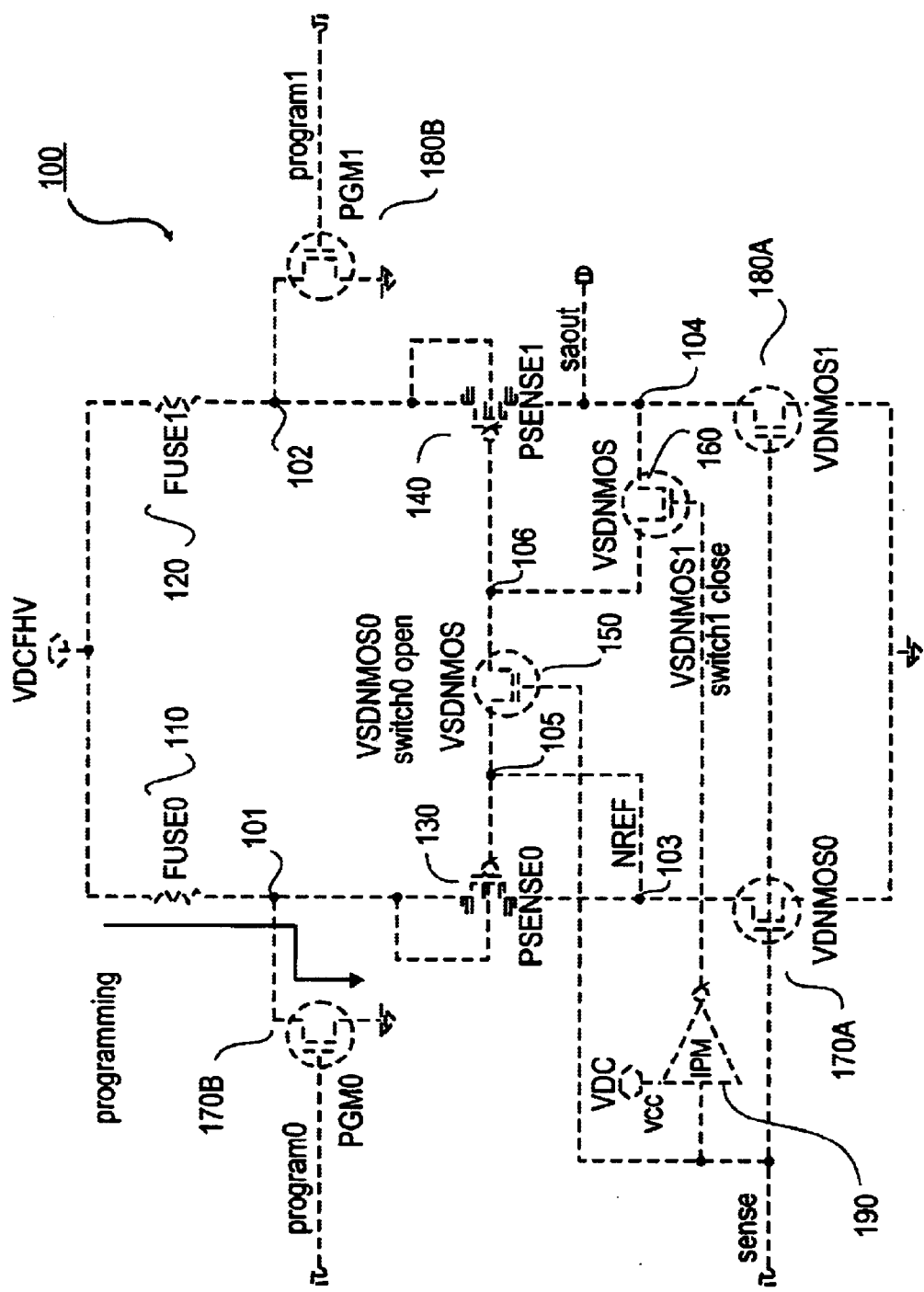
FIGS. 2A–2B illustrate an example fuse circuit utilizing high voltage transistors as switches for fuse programming and sensing according to an example embodiment of the present invention.
Figure 2B:
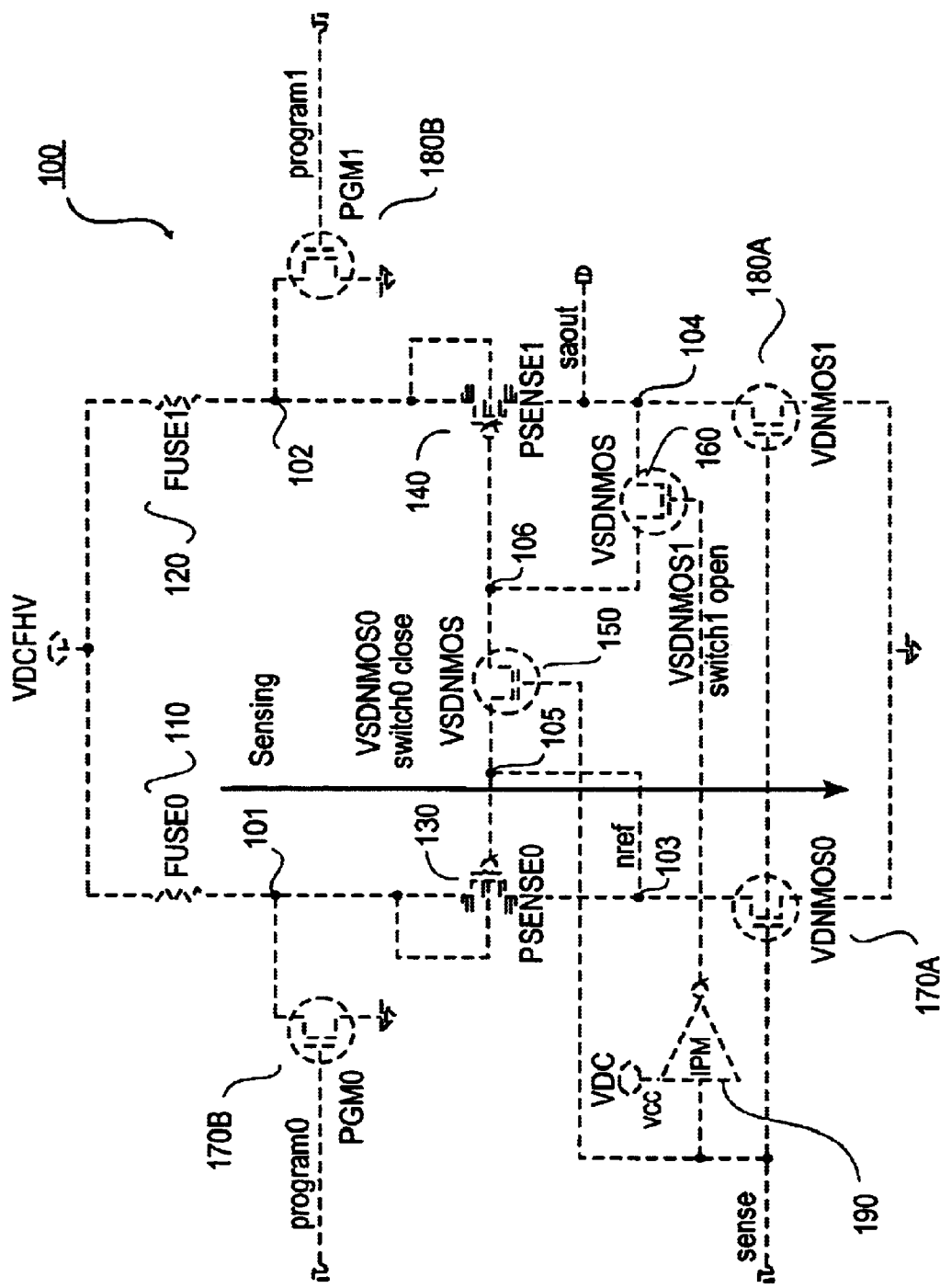

FIGS. 2A–2B illustrate an example fuse circuit utilizing high voltage transistors serving as switches for fuse programming and sensing as described with reference to FIGS. 1A–1B. However, for purposes of completeness, symbolic switches (switchØ and switch1) are replaced by actual VSDNMOS transistors 150 and 160. As shown in FIGS. 2A–2B, the VSDNMOS transistor 150 has its gate electrode (G) coupled to receive a sense signal, and its drain/source connected to the gate electrode (G) of the PMOS transistor 130 and the gate electrode (G) of the PMOS transistor 140. Similarly, the VSDNMOS transistor 160 has its gate electrode (G) coupled to receive a sense signal, and its drain/source connected to the drain (D) and the gate electrode (G) of the PMOS transistor 140. In addition, an inverter 190 may be driven from a regular core voltage terminal $V_{cc}$, and used to control the polarity of the sense signal to ensure that the VSDNMOS transistors 150–160 are either open/closed or closed/open. As described with reference to FIGS. 1A–1B, both VSDNMOS transistors 150–160 are used as switches to bypass the PMOS transistor reliability limitation and enable higher programming voltage for optimal programming yield.

The example fuse circuit 100 as shown in FIGS. 1A–1B and 2A–2B may be operated in at least two states with respect to the fuseΦ 110, i.e., programmed open (to blow the fuse 110 during programming), and programmed short (to protect the fuse 110 during programming another selected fuse).

Discussion turns first to the programming operation of the fuseΦ 110, for example. When the program signal is asserted as an active "high", the PMOS transistor 130 is turned "on". The sense signals are "off" and, likewise, the VDNMOS transistors 170A and 180A are turned "off". The VSDNMOS transistor 150 is also turned "off" (switchΦ is open) while the VSDNMOS transistor 160 is turned "on" (switch1 is closed, as well as all other switches in the fuse array). With VSDNMOS transistor 150 "off", node 101 is effectively pulled down and sustained by the VDNMOS transistor 170A which cause a large voltage drop, i.e., a high voltage such as 4–5 volts provided from the fuse high voltage terminal $V_{ccfhv}$ across the fuseΦ 110 in order to burn (blow) the fuse 110.

Turning next to the sensing operation of the fused 110, when the program signal is de-asserted as an active "low" and the sense signal is asserted as an active "high". Both the VDNMOS transistors 170A and 180A are turned "on", and the PMOS transistor 130 is also turned "on". The VSDNMOS transistor 150 is also turned "off" (switchΦ is closed), while the VSDNMOS transistor 160 is turned "on" (switch1 is open, as well as all other switches in a fuse array). With VSDNMOS transistor 150 "off" (switchΦ is closed) and VSDNMOS transistor 160 "on" (switch1 is open), the PMOS transistors 130 and 140 are in a current-mirror configuration, acting as a sense amplifier to sense the status of the fuseΦ 110.

An example operation truth table with respect to the example fuse circuit 100 as shown in FIGS. 1A–1B and 2A–2B can be provided, but not limited thereto, as follows.

P-substrate 310. The N-well 320 may be formed in the P-substrate 310 through ion implantation and/or diffusion of a dopant or dopants having the N-type conductivity, which is opposite that of the substrate 310. The STI regions 330 may be formed in the N-well 320 through chemical etching and filling therein with an insulation material, such as oxide.

A gate electrode 340 may be formed on upper portions of the N-well 320, and may be formed by depositing a P-type polysilicon layer on the upper portions of the N-well 320. Diffusion regions 324 and 326 may be formed in the N-well 320 at a portion near the edge of the gate electrode 340 to serve as either a source (S) or drain (D) of the PMOS transistor 130 or 140. Such diffusion regions 324 and 326 may be formed by implanting a conductive dopant which is different from the N-well for forming a PMOS transistor 130 or 140. In particular, the diffusion regions 324 and 326 may be heavily doped with P+ dopant(s) to improve contact between a metal layer which forms metal lines 350A–350C and a gate oxide layer 342 disposed underneath the gate electrode 340.

| ProgΦ | Prog 1 | Sense | PGMΦ | PGM1 | VDNMOSΦ | VDNMOS1 | PsenseΦ | Psense1 |
|---|---|---|---|---|---|---|---|---|
| 0 | 0 | 0 | OFF | OFF | OFF | OFF | ON | ON |
| 1 | 0 | 0 | ON | OFF | OFF | OFF | ON | ON |
| 0 | 1 | 0 | OFF | ON | OFF | OFF | ON | ON |
| 0 | 0 | 1 | OFF | OFF | ON | ON | ON | ON |
| 1 | 0 | 1 | not allowed---- | | | | | |
| 0 | 1 | 1 | not allowed---- | | | | | |

| VSDNMOSΦ | VSDNMOS1 | FuseΦ | Fuse1 | Saout |
|---|---|---|---|---|
| OFF | ON | x | x | x |
| OFF | ON | prog | not-prog | x |
| OFF | ONN | not-prog | prog | x |
| ON | OFF | depends (program history) | same | same |

During programming the fuseΦ 110, the VSDNMOS transistor 160 and the VDNMOS transistor 180A, as shown in FIGS. 1A–1B and 2A–2B, may also be used to protect non-selected fuse 120 from stress. In particular, the VDNMOS transistor 180B may be turned "off" and the VDNMOS transistor 180A can tolerate high voltage on the drain (D) side in order to ensure that no high voltage can cross the fuse 120.

During sensing the fuseΦ 110, the VDNMOS transistors 170B and 180B are turned "off". The VDNMOS transistors 170A and 180A are turned "on". The VSDNMOS transistor 150 is closed and, likewise, the VSDNMOS transistor 160 is open so that both the VSDMOS transistors 150 and 160 are arranged in a current mirror configuration to sense the status of the fuse 110 for subsequent repair of a defective component within an IC device (not shown), i.e., to isolate the defective component and to selectively connect the redundant component in place of the defective component within the IC device.

Figure 3:
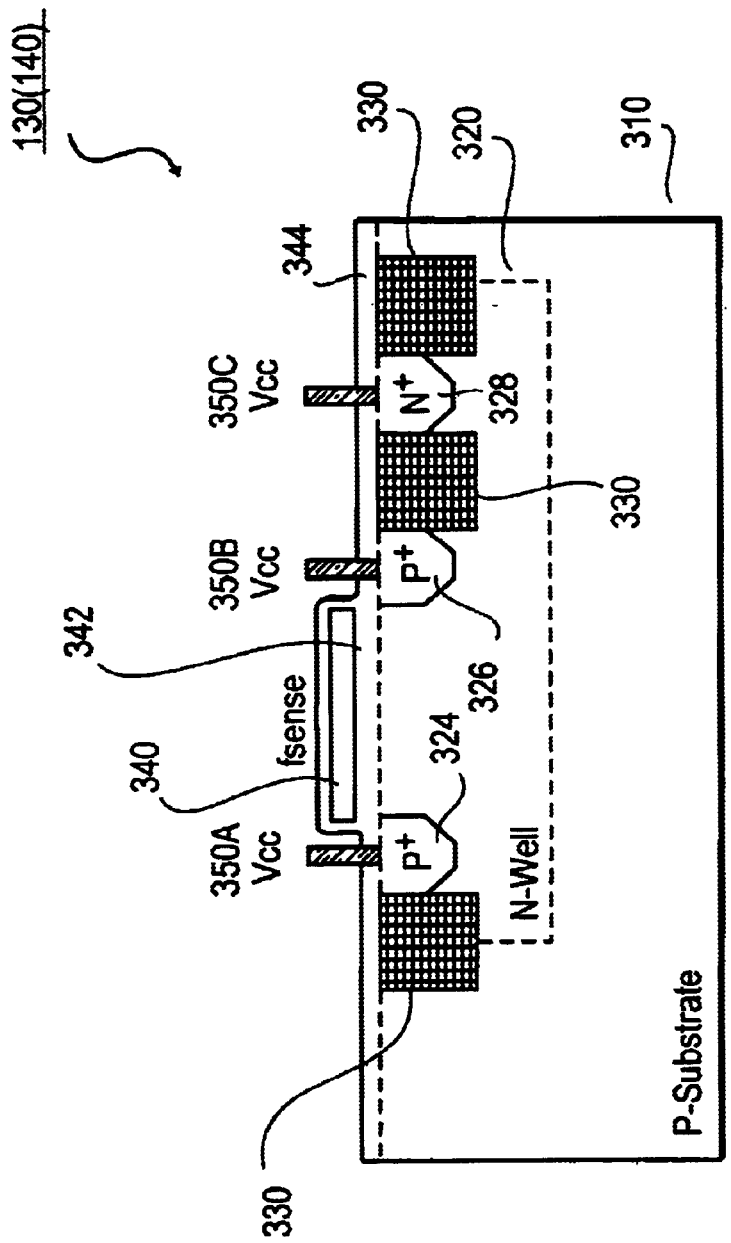
FIG. 3 illustrates a cross-sectional view of an example PMOS transistor according to an example embodiment of the present invention.
Figure 4:
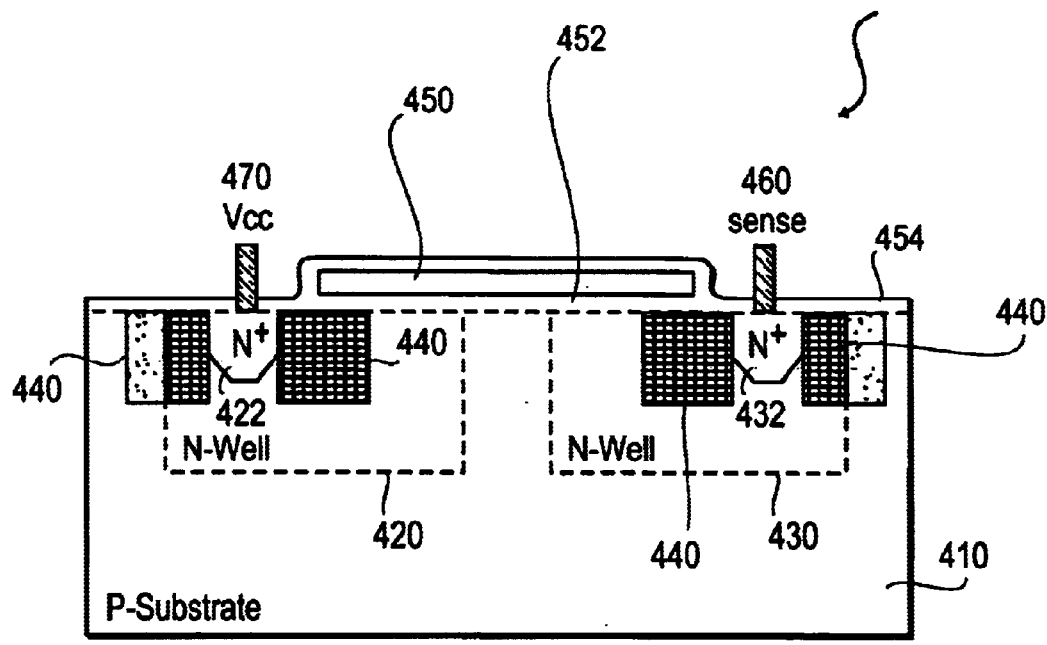
FIG. 4 illustrates a cross-sectional view of an example vertical-source-drain NMOS (VSDNMOS) transistor used as a switch to enable high fuse programming voltage during programming according to an embodiment of the present invention.
Figure 5:
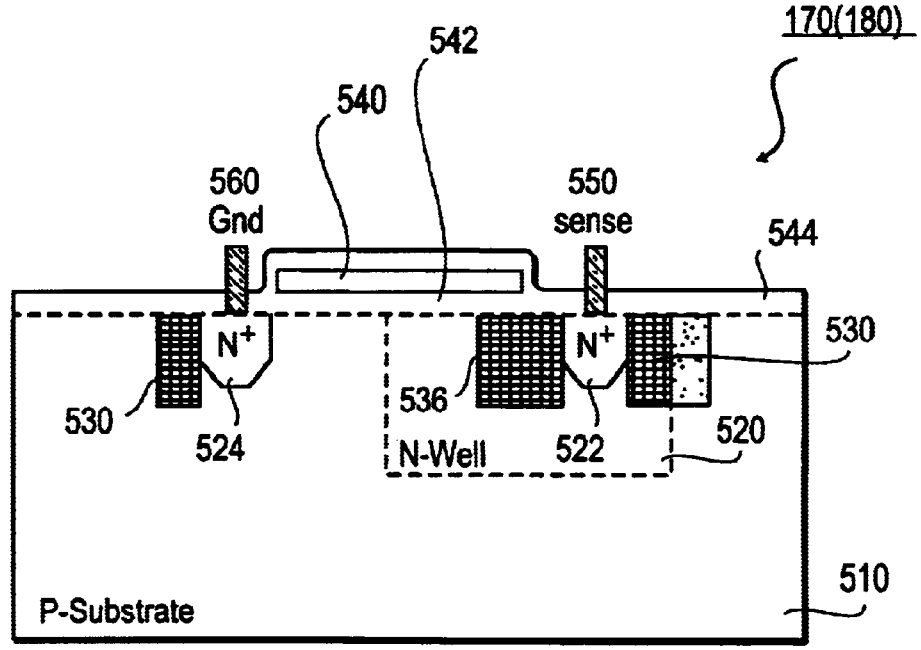
FIG. 5 illustrates a cross-sectional view of an example vertical-drain NMOS (VDNMOS) transistor used to sustain high fuse programming voltage needed to burn (or blow) the fuse according to an example embodiment of the present invention.

Turning now to FIGS. 3–5, example PMOS transistors 130–140, example VSDNMOS transistors 150–160, and example VDNMOS transistors 170A–180A and 170B–180B are shown, but not limited thereto.

Specifically, FIG. 3 illustrates a cross-sectional view of an example PMOS transistor 130 or 140 according to an embodiment of the present invention. As shown in FIG. 3, the N-well 320 may be formed on a P-substrate 310, and shallow trench isolation (STI) regions 330 may be formed to provide isolation of various regions formed in the A diffusion region 328 may also be formed in the N-well 320, and may also be heavily doped with N+ dopant(s) to establish connection to the N-well 320, via a contact line 350C. Metal lines 350A–350C may be formed or bonded to the source/drain regions 324 and 326 and the diffusion region 328 for establishing connection between the source/drain regions 324 and 326 of the PMOS transistor 130 or 140 and a regular voltage terminal $V_{cc}$. Thereafter, an insulation layer 344 may be deposited on the substrate 310 including the above-described PMOS transistor 130 or 140. Such an insulation layer 344 may be silicon oxide deposited over the entire surface of the substrate 310, or "grown" using, for example, a rapid thermal processing (RTP) tool. Alternatively, the insulation layer 344 may be silicon nitride or other insulation material that is either grown or deposited on the entire surface of the substrate 310.

FIG. 4 illustrates a cross-sectional view of a vertical-source-drain NMOS (VSDNMOS) transistor 150 or 160 used as a switch according to an embodiment of the present invention. As shown in FIG. 4, the N-wells 420 and 430 may be formed on a P-substrate 410, and shallow trench isolation (STI) regions 440 may be formed to provide isolation of various regions formed in the P-substrate 410. The N-wells 420 and 430 may be formed in the P-substrate 410 through ion implantation and/or diffusion of dopant(s) having the N-type conductivity, which is opposite that of the substrate 410. The STI regions 440 may be formed in the N-wells 420 and 430 through chemical etching and filling therein with an insulation material, such as oxide.

A gate electrode 450 may then be formed on upper portions of the N-wells 420 and 430, and may be formed by depositing a N-type polysilicon layer on the upper portions of the N-wells 420 and 430. Diffusion regions 422 and 432 are formed in the N-wells 420 and 430 at a portion near the edge of the gate electrode 450 to serve as a drain region (D) and a source region (S) of the VSDNMOS transistor 150 or 160, respectively. Such diffusion regions 422 and 432 may be heavily doped with N+ dopant(s) to improve contact resistance between a metal layer which forms metal lines 460 and 470 and a gate oxide layer 452 disposed underneath the gate electrode (G) 450. The gate oxide layer 452 may exhibit a thickness of approximately 20–30 Å to offer enhanced programming capability.

Metal line 470 may be formed to connect the drain region (D) 422 to a regular voltage terminal $V_{cc}$. Similarly, the metal line 360 may be formed to connect the source region (S) 432 to a sense terminal fsense. Thereafter, an insulation layer 454 may be deposited on the substrate 410 including the above-described VSDNMOS transistor 150 or 160. Such an insulation layer 454 may be silicon oxide deposited over the entire surface of the substrate 410, or "grown" using, for example, a rapid thermal processing (RTP) tool. Alternatively, the insulation layer 454 may be silicon nitride or other insulation material that is either grown or deposited on the entire surface of the substrate 410.

FIG. 5 illustrates a cross-sectional view of a vertical-drain NMOS (VDNMOS) transistor 170A–180A or 170B–180B used to sustain high programming voltage needed to breakdown the fuseø or fuse1 according to an embodiment of the present invention. As shown in FIG. 5, the N-well 520 may be formed on a P-substrate 510, and shallow trench isolation (STI) regions 530 may be formed to provide isolation of various regions formed in the P-substrate 510. The N-well 520 may be formed in the P-substrate 510 through ion implantation and/or diffusion of dopant(s) having the N-type conductivity, which is opposite that of the substrate 510. The STI regions 530 may be formed in the N-well 520 through chemical etching and filling therein with an insulation material, such as oxide.

A gate electrode 540 may be formed on an upper portion of the N-well 520 and the P-substrate 510, and may be formed by depositing a N-type polysilicon layer on the upper portions of the N-well 520 and the P-substrate 510. Diffusion regions 522 and 524 may be formed in the N-well 520 and in the P-substrate 510 at a portion near the edge of the gate electrode 540 to serve as a drain region (D) and a source region (S) of the VDNMOS transistor 170A–180A or 170B–180B, respectively. Such diffusion regions 522 and 524 may be heavily doped with N+ dopant(s) to improve contact resistance between a metal layer which forms metal lines 550 and 560 and a gate oxide layer 542 disposed underneath the gate electrode 540. The gate oxide layer 542 may also exhibit a thickness of approximately 20–30 Å to offer enhanced programming capability.

Metal line 550 may be formed to connect the drain region (D) 522 to a sense terminal fsense. Similarly, the metal line 560 may be formed to connect the source region (S) 524 to a ground terminal. Thereafter, an insulation layer 544 may be deposited on the substrate 510 including the above-described VDNMOS transistor 170A–180A or 170B–180B. Such an insulation layer 544 may be silicon oxide deposited over the entire surface of the substrate 510, or "grown" using, for example, a rapid thermal processing (RTP) tool. Alternatively, the insulation layer 544 may be silicon nitride or other insulation material that is either grown or deposited on the entire surface of the substrate 510.

Figure 6:
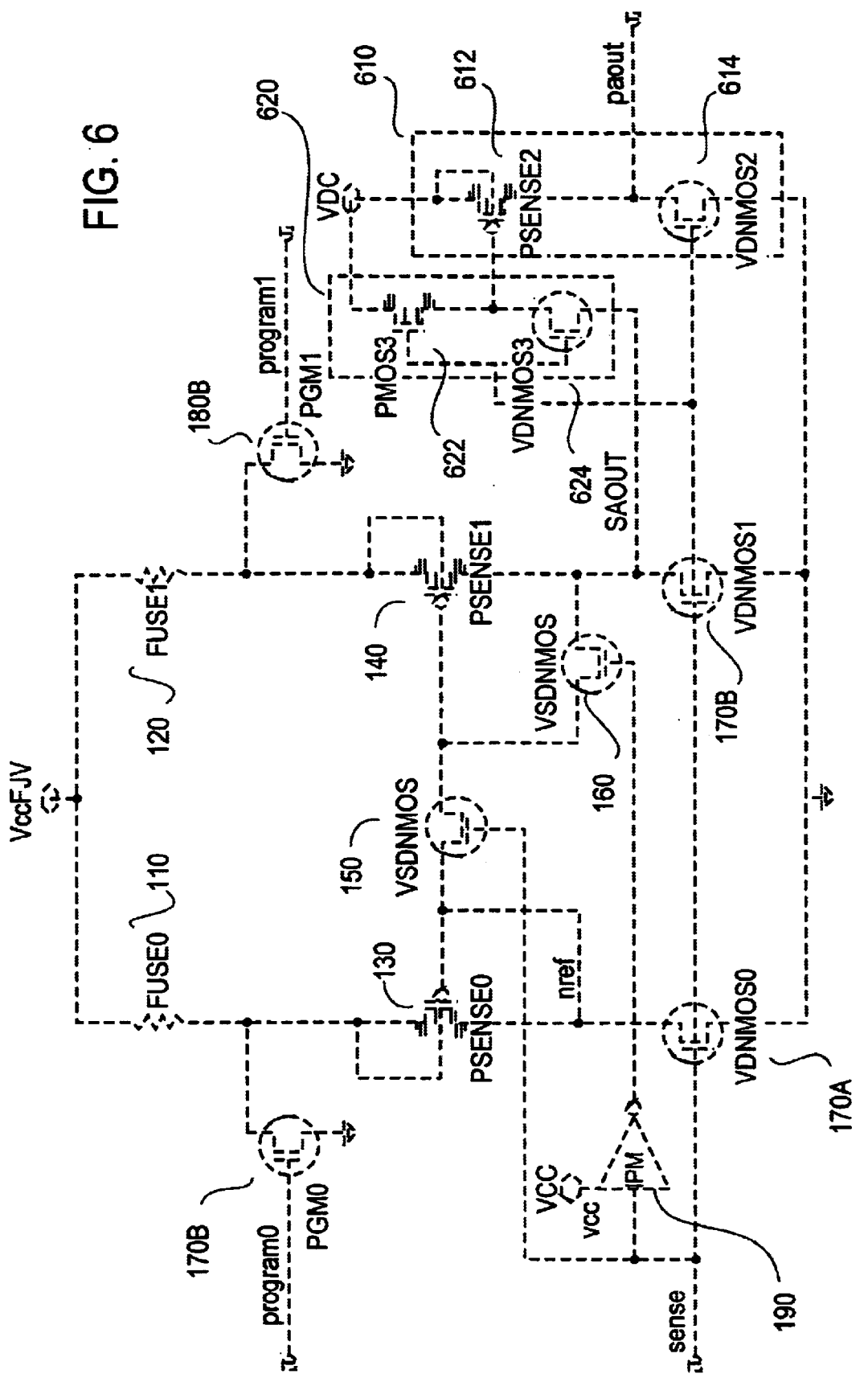
FIG. 6 illustrates an example complete schematic of an example fuse circuit arranged for programming and sensing operations according to an embodiment of the present invention.

FIG. 6 illustrates a complete schematic of an example fuse circuit 100 according to an embodiment of the present invention. Similar to FIGS. 1A–1B and 2A–2B, the fuse circuit 100 further includes a matched post-amplifier 610 arranged to convert an analog output from SAOUT terminal into digital output; and a pass-gate 620 disposed between the SAOUT terminal and the matched post-amplifier 610 to protect downstream transistors during high voltage programming.

As shown in FIG. 6, the matched post-amplifier 610 may include an additional PMOS transistor 612 and an additional VDNMOS transistor 614. Likewise, the pass-gate 620 may include a PMOS transistor 622 and a VDNMOS transistor 624.

Both the PMOS transistor 612 and the VDNMOS transistor 614 are matched to the PMOS transistor 140 and the VDNMOS transistor 180A in size and layout. As a result, the matched post-amplifier 610 trip-point tracks with the centerpoint of $1^{st}$ stage sense amplifier which is composed of current-mirror PMOS transistors 130–140 (PMOS transistors 130–140 are connected since VSDNMOS transistor 150 is closed during sensing) in order to significantly reduce the circuit sensitivity to process shift, such as PMOS/VDNMOS strength ratio shift and, as a result, greatly improve fuse programming yield.

Figure 7:
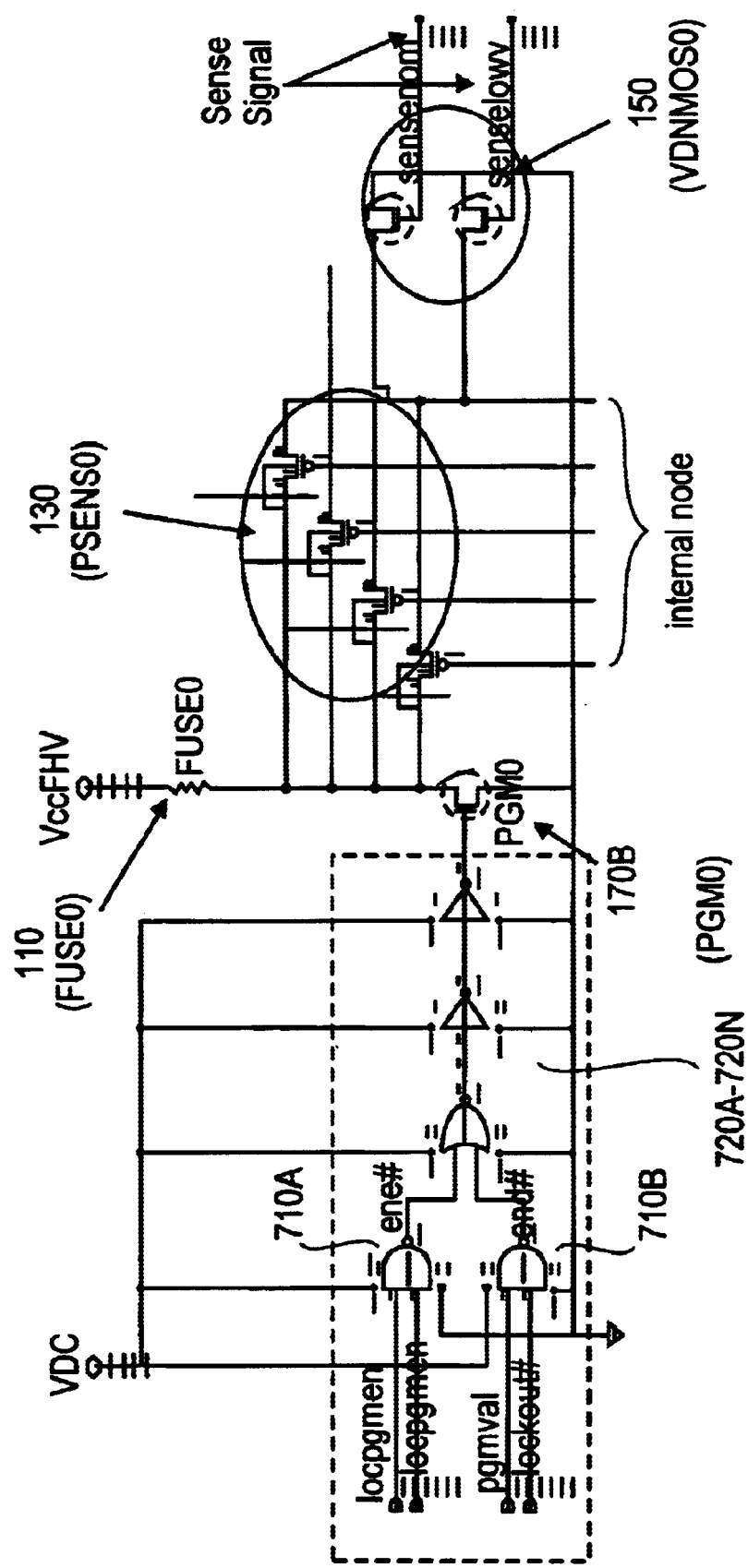
FIG. 7 illustrates an example implementation schematic of an example fuse circuit containing programming and sensing paths according to an embodiment of the present invention.

FIG. 7 illustrates an example actual implementation schematic of an example fuse circuit 100 containing programming and sensing paths according to an embodiment of the present invention. For the sake of simplicity, only a selected fuse 110 is described herein along with programming and sensing paths. As shown in FIG. 7, multiple PMOS transistors 130 and VDNMOS transistors 170A may be used to provide flexibility. VSDMOS transistors (switches) 150–160 are not shown.

For purposes of controlling the programming of an individual fuse in a fuse array, such as fuseΦ 110, multiple program control signals may be used. Logic gates 710A–710B, such as AND gates, may be disposed between a regular core voltage terminal $V_{cc}$ and a ground node Vss, and may be arranged to receive a program signal along with these program control signals. The program signal may be asserted as an active "high" or "1" during programming (e.g., fuseΦ 110 or fuse1 120), or de-asserted as an active "low" or "0" during sensing (e.g., fuseΦ 110 or fuse1 120). In contrast, the sense signal (not shown) may be asserted as an active "high" or "1" during sensing, or de-asserted as an active "low" or "0" during programming. The active "high" may be set at 1.2 volts, and the active "low" may be set at 0 volt as shown in FIGS. 1A–1B and 2A–2B.

In addition to the program signal, other program control signals may include: (1) fuse control signals (locpgmen and pgmval) which control which fuse in the fuse array to be programmed (program fuse one at a time); (2) a global control signal (globpgmen) which activates all fuses (entire circuit) for programming operation; and (3) a safety lockout signal (lockout#) which allows fuse programming ("1" to enable fuse programming, or "0" to disable any fuse programming, regardless other control signals).

Delay elements, i.e., inverters 720A–720N may also be arranged to receive the logical combinations of the program signal and other program control signals to produce a program output. The program output of the inverters 720A–720N may then be coupled to the gate electrode (G) of the VDNMOS 170B. The drain (D) of the VDNMOS transistor 150 may be coupled to node 101, and the source (S) of the VDNMOS transistor 150 may be coupled to a ground node Vss.

By programming one of the fuses 110 or 120 in the example fuse circuit 100 shown in FIGS. 1A–1B, 2A–2B and FIGS. 5–6, the fuse circuit 100 can be employed in a fuse array (bank) for programming to respond to specific values of address signals for replacing primary circuit elements, such as row or columns of a DRAM, with redundant circuit elements. In addition, the fuse circuit 100 can alternatively be employed in a variety of circuit applications where a programming feature is required. For example, multiple fuse circuits may be utilized to generate fuse identification (ID) for an IC device. The fuse ID is a pattern of binary digits to uniquely identify the IC device and can be decoded after the IC device is packaged or integrated onto a circuit board.

Figure 8:
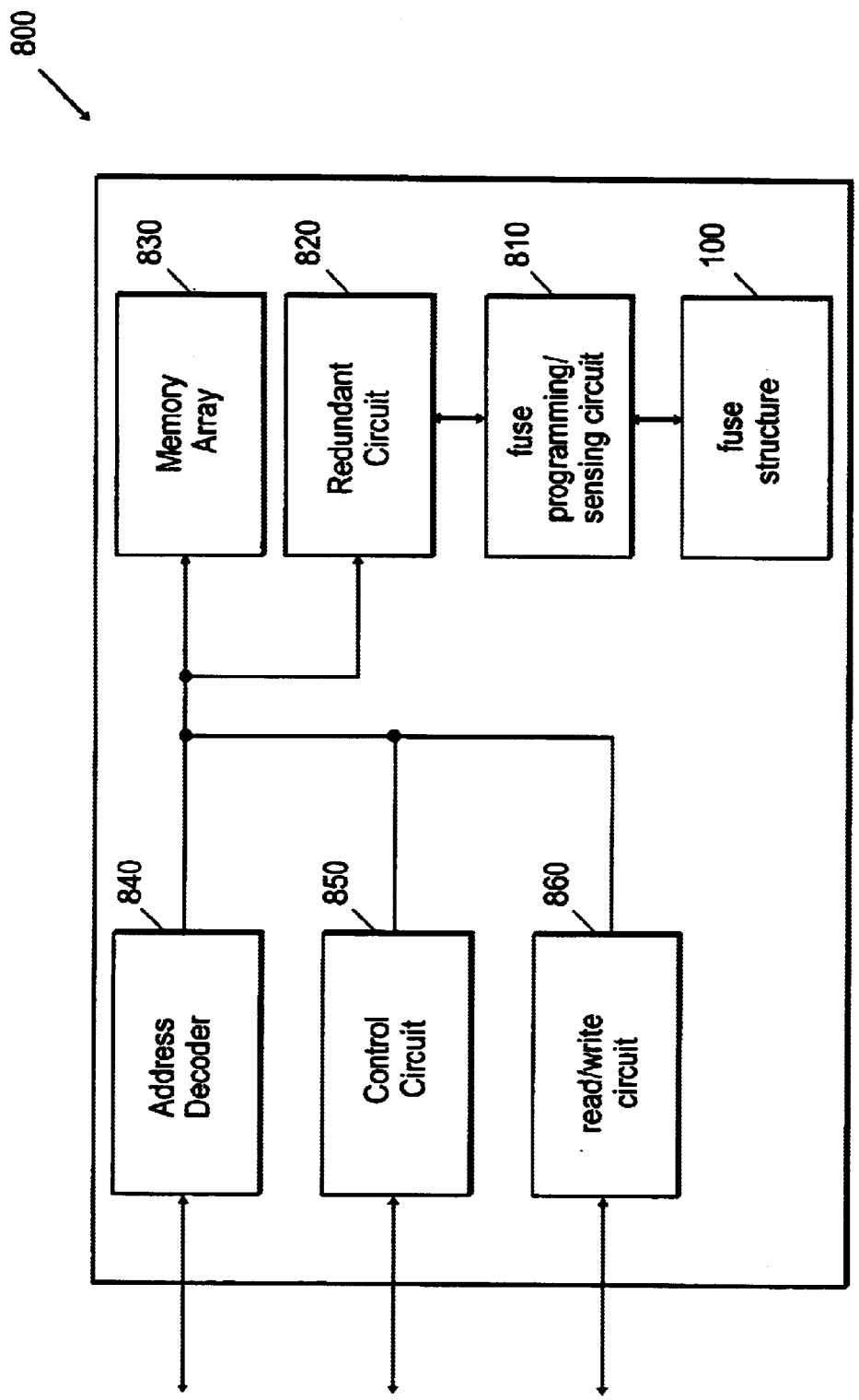
FIG. 8 illustrates an example IC device including an example fuse circuit according to an embodiment of the present invention.

FIG. 8 illustrates an example IC device including a fuse circuit 100 according to an embodiment of the present invention. As shown in FIG. 8, in addition to the fuse circuit 100, the IC device 800 includes a fuse programming/sensing circuit 810, a redundant circuit 720, a memory array 830 and other well-known I/O circuitry such as, for example, an address decoder 840, a control circuit 850, and a read/write circuit 860.

The fuse programming/sensing circuit 810 may be included in the fuse structure 100. Alternatively, such a fuse programming/sensing circuit 810 may independently contain an example programming circuit 700 and other sensing circuits in the form of multiple VDNMOS transistors shown in FIG. 7. The fuse programming/sensing circuit 810 may be connected to an enable terminal of the redundant circuit 820 containing a plurality of redundant memory cells that are used to replace defective memory cells in a memory array 830.

The address decoder 840, control circuit 850, and read/write circuitry 860 may be coupled to the memory array 860. In addition, the address decoder 840 may be coupled to an address bus, the control circuit 850 may be coupled to a control bus, and the read/write circuit 860 may be coupled to a data bus. In operation, external circuitry controls operation of the IC device 800 including the fuse programming/sensing circuit 810 to program the desired fuse 110, for example, in the fuse structure 100. When the input program signal is asserted "high", the fuse circuit 810 can program (blow) the fuse 110, for example. When the fuse 110 has been blown, the redundant circuit 820 may operate, for example, to replace a row of memory cells in the memory array 830 with redundant memory cells contained within the redundant circuit 820. Operations of the address decoder 840, control circuit 850, and read/write circuitry 860 during read and write data transfer operations are conventional and well-known in the art and, therefore, need not be described in detail herein.

Figure 9:
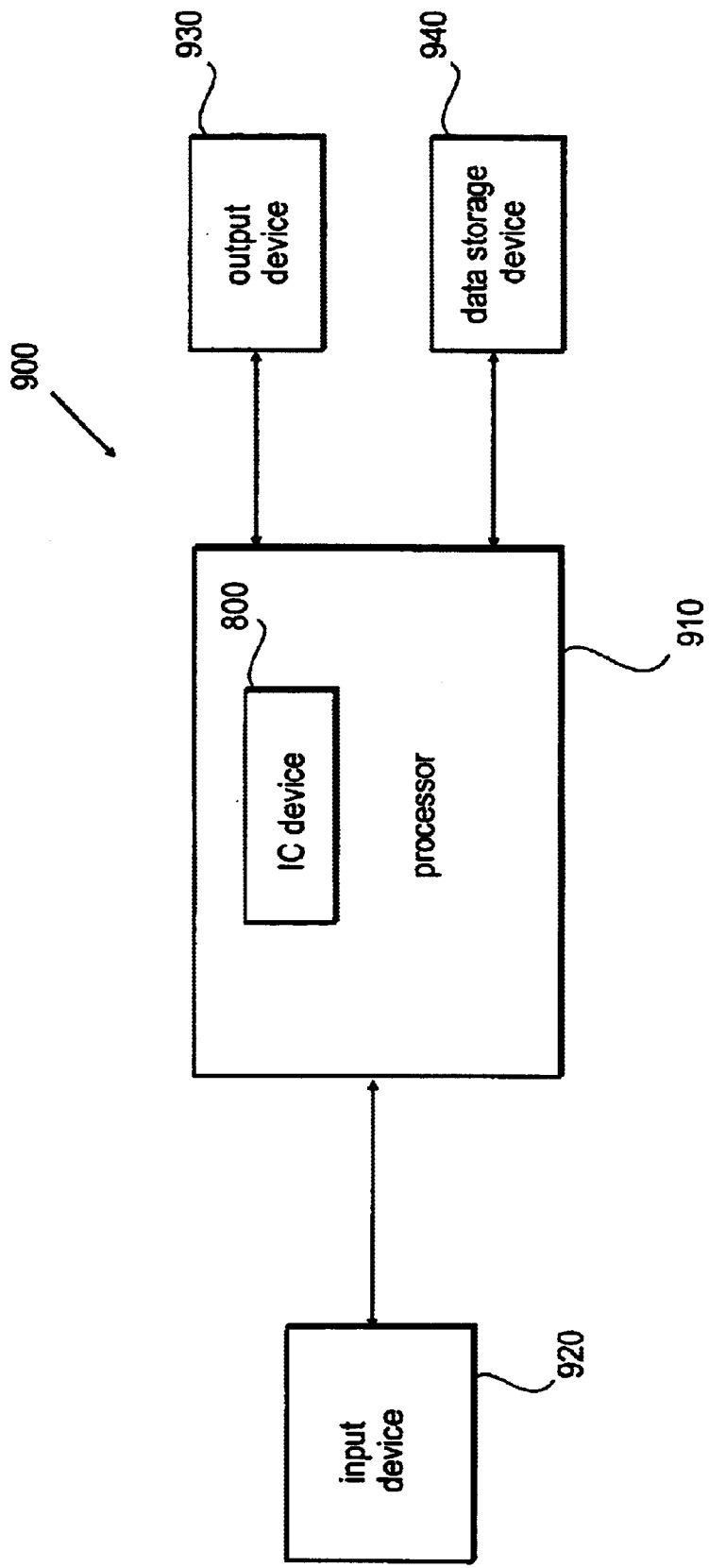
FIG. 9 illustrates an example computer system including the IC device shown in FIG. 8.

FIG. 9 illustrates an example computer system 900 including the IC device 800 shown in FIG. 8. The computer system 900 includes a processor 910 for performing various computing functions, such as executing specific software to perform specific calculations or tasks. In addition, the computer system 900 includes one or more input devices 920, such as a keyboard or a mouse, coupled to the processor 910 to allow an operator to interface with the computer system 900. Typically, the computer system 900 also includes one or more output devices 930 coupled to the processor 910, such output devices typically being a printer or a video terminal. One or more data storage devices 940 are also typically coupled to the processor 910 to store data or retrieve data from external storage media (not shown). Examples of typical storage devices 940 include EPROM, EEPROM, and flash devices; magnetic disks (fixed, floppy, and removable); other magnetic media such as tape cassettes; and optical media such as CD-ROM disks. The processor 910 is typically coupled to the IC device 800 through a control bus, a data bus, and an address bus to provide for writing data to and reading data from the IC device 800.

As described from the foregoing, the present invention advantageously provides a fuse structure for implementation within IC devices formed using standard CMOS processes which utilizes high voltage transistors configured to operate with high fuse programming voltage for optimal fuse programming yield.

While there have been illustrated and described what are considered to be example embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. For example, the fuse can be implemented using different technologies. Similarly, the fuse programming circuit and the sensing circuit can be implemented with a different arrangement of delay elements and logic gates, such as AND, NAND, OR and XOR gates. Therefore, it is intended that the present invention not be limited to the various example embodiments disclosed, but that the present invention includes all embodiments falling within the scope of the appended claims.

What is claimed is:

1. A fuse circuit for an IC device, comprising:
    a fuse element connected to a fuse voltage terminal;
    a sense circuit to enable programming the fuse element with a fuse program voltage from the fuse voltage terminal during programming, and to sense the status of the fuse element during sensing, said sensing circuit comprising:
        first and second transistors arranged in series with the fuse element to enable sensing the status of the fuse element; and
        a third transistor arranged to serve as a switch to enable the first transistor to tolerate the fuse program voltage with its maximum break-down voltage limited to a maximum burn-in voltage of the second transistor.

2. The fuse circuit as claimed in claim 1, wherein the first transistor is a PMOS transistor, the second transistor is a vertical-drain NMOS transistor operable to tolerate high voltage at a drain side, and the third transistor is a vertical-source-drain NMOS transistor operable as a switch to tolerate high voltage at both source and drain side.

3. The fuse circuit as claimed in claim 1, wherein the fuse element is a poly-silicon fuse.

4. The fuse circuit as claimed in claim 2, wherein the PMOS transistor is formed in a N-well of a P-substrate, the PMOS transistor comprising:
    source/drain regions formed and spaced-apart in the N-well, and heavily doped with P+ dopant(s);
    a diffusion region formed in the N-well, and heavily doped with N+ dopant(s);
    shallow trench isolation (STI) regions formed in the N-well to provide isolation between the diffusion region and the source/drain regions;
    a gate electrode formed over the source and drain regions, and isolated from the source and drain regions by an oxide layer;

metal lines bonded to the source/drain regions and the diffusion region, for coupling the source/drain regions to the fuse voltage terminal; and an insulation layer deposited on the P-substrate including the N-well.

5. The fuse circuit as claimed in claim 2, further comprising a program circuit arranged to program the fuse element with the fuse program voltage in response to a program signal.

6. The fuse circuit as claimed in claim 5, wherein the program circuit comprises:

a vertical-drain DNMOS transistor connected to the fuse element to program the fuse element in response to application of the program signal;

logic gates arranged to receive the program signal and control signals, and to produce a logic signal to activate or de-activate operation of the vertical-drain NMOS transistor; and a series of delay elements arranged to receive the logic signal, and activate an active "high" state at an output to enable operation of the vertical-drain NMOS transistor.

7. The fuse circuit as claimed in claim 6, wherein the sense circuit senses the status of the fuse element during sensing for subsequently exchanging a defective circuit element in the IC device with a redundant circuit element.

8. An IC device, comprising:

a fuse structure comprising at least first and second fuses each coupled to a fuse voltage terminal; first and second PMOS transistors arranged in series with the first and second fuses to sense the status of the first and second fuses and to tolerate high voltage from the fuse voltage terminal to burn a selected fuse; first and second vertical-source-drain NMOS transistors arranged to serve as switches alternately operable to enable the first and second PMOS transistors to tolerate the high voltage; and first and second vertical-drain NMOS transistors arranged in series with the first and second PMOS transistors with gate electrodes coupled to response to a sense signal; and a program circuit coupled to program the selected fuse in response to a program signal through application of the high voltage from the fuse voltage terminal.

9. An IC device as claimed in claim 8, wherein the first and second vertical-source-drain NMOS transistors tolerate high voltage at both source and drain side, and the first and second vertical-drain NMOS transistors tolerate high voltage at the drain side.

10. An IC device as claimed in claim 8, wherein each of the first and second PMOS transistors is formed in a N-well of a P-substrate, each PMOS transistor comprising:

source/drain regions formed and spaced-apart in the N-well, and heavily doped with P+ dopant(s);

a diffusion region formed in the N-well, and heavily doped with N+ dopant(s);

shallow trench isolation (STI) regions formed in the N-well to provide isolation between the diffusion region and the source/drain regions;

a gate electrode formed over the source and drain regions, and isolated from the source and drain regions by an oxide layer;

metal lines bonded to the source/drain regions and the diffusion region, for coupling the source/drain regions to the fuse voltage terminal; and an insulation layer deposited on the P-substrate including the N-well.

11. An IC device as claimed in claim 10, wherein the program circuit comprises:

vertical-drain NMOS transistors connected to the first and second fuses to program the selected fuse in response to application of the program signal;

logic gates arranged to receive the program signal and control signals, and to produce a logic signal to activate or de-activate operation of the vertical-drain NMOS transistors; and a series of delay elements arranged to receive the logic signal, and activate an active "high" state at an output to enable operation of the vertical-drain NMOS transistors.

12. An IC device as claimed in claim 10, further comprising:

an address decoder coupled to an address bus;

a control circuit coupled to an control bus;

a read/write circuit coupled to a data bus;

a memory array coupled to the address decoder, the control circuit, and the read/write circuit, and having a plurality of memory cells; and a redundant circuit coupled to the program circuit and the fuse structure, the redundant circuit having a plurality of redundant memory cells used to replace defective memory cells in the memory array, and replacing one or more selected defective memory cells in the memory array with one or more redundant memory cells in response to the program status of the first and second fuses.

13. A computer system, comprising:

a data input device;

a data output device; and a processor coupled to the data input device and the data output device, the processor including an IC device that includes a fuse circuit used to respond to a program voltage for replacing primary circuit element with redundant circuit element, wherein the fuse circuit comprises at least one fuse element coupled to a fuse voltage terminal; a PMOS transistor connected to the fuse element; a vertical-source-drain NMOS transistor arranged to serve as a switch to enable the PMOS transistor to tolerate higher program voltage with its maximum break-down voltage limited to a maximum burn-in voltage of a vertical-drain NMOS transistor arranged in series with the PMOS transistor to sense a status of the fuse element.

14. A computer system as claimed in claim 13, further comprising a program circuit coupled to receive a program signal and operable to program the fuse element through application of the program voltage.

15. A computer system as claimed in claim 14, wherein the vertical-source-drain NMOS transistor is operable to tolerate high voltage at both source and drain side, and the vertical-drain NMOS transistor is operable to tolerate high voltage at the drain side.

16. A computer system as claimed in claim 13, wherein the fuse element is a poly silicon fuse.

17. A computer system as claimed in claim 14, wherein the PMOS transistor is formed in a N-well of a P-substrate, and comprising:

source/drain regions formed and spaced-apart in the N-well, and heavily doped with P+ dopant(s);

a diffusion region formed in the N-well, and heavily doped with N+ dopant(s);

shallow trench isolation (STI) regions formed in the N-well to provide isolation between the diffusion region and the source/drain regions;

a gate electrode formed over the source and drain regions, and isolated from the source and drain regions by an oxide layer;

metal lines bonded to the source/drain regions and the diffusion region, for coupling the source/drain regions to the fuse voltage terminal; and an insulation layer deposited on the P-substrate including the N-well.

18. A computer system as claimed in claim 14, wherein the program circuit comprises:

a vertical-drain NMOS transistor connected to the fuse element to program the fuse element in response to application of the program signal;

logic gates arranged to receive the program signal and control signals, and to produce a logic signal to activate or de-activate operation of the vertical-drain NMOS transistor; and a series of delay elements arranged to receive the logic signal, and activate an active "high" state at an output to enable operation of the vertical-drain NMOS transistor.

* * * * *